(12) United States Patent
Adam et al.

(10) Patent No.: US 8,361,889 B2
(45) Date of Patent: Jan. 29, 2013

(54) STRAINED SEMICONDUCTOR-ON-INSULATOR BY ADDITION AND REMOVAL OF ATOMS IN A SEMICONDUCTOR-ON-INSULATOR

(75) Inventors: Thomas N. Adam, Slingerlands, NY (US); Stephen W. Bedell, Wappingers Falls, NY (US); Joel P. de Souza, Putnam Valley, NY (US); Keith E. Fogel, Hopewell Junction, NY (US); Alexander Reznicek, Mount Kisco, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 12/830,626

(22) Filed: Jul. 6, 2010

(65) Prior Publication Data

US 2012/0009766 A1    Jan. 12, 2012

(51) Int. Cl.
*H01L 21/20*    (2006.01)
(52) U.S. Cl. ........................................ 438/479; 438/475
(58) Field of Classification Search .................. 438/475, 438/479

See application file for complete search history.

(56) References Cited

U.S. PATENT DOCUMENTS

| 7,023,055 | B2 | 4/2006 | Ieong et al. | |
|---|---|---|---|---|
| 7,329,923 | B2 | 2/2008 | Doris et al. | |
| 2004/0245571 | A1* | 12/2004 | Cheng et al. | 257/347 |
| 2005/0116290 | A1 | 6/2005 | de Souza et al. | |
| 2006/0211221 | A1* | 9/2006 | Mantl et al. | 438/475 |
| 2009/0298301 | A1* | 12/2009 | Mantl | 438/795 |

* cited by examiner

*Primary Examiner* — Douglas Menz
(74) *Attorney, Agent, or Firm* — Scully, Scott, Murphy & Presser, P.C.; Louis J. Percello, Esq.

(57) ABSTRACT

A method of forming a strained semiconductor-on-insulator (SSOI) substrate that does not include wafer bonding is provided. In this disclosure a relaxed and doped silicon layer is formed on an upper surface of a silicon-on-insulator (SOI) substrate. In one embodiment, the dopant within the relaxed and doped silicon layer has an atomic size that is smaller than the atomic size of silicon and, as such, the in-plane lattice parameter of the relaxed and doped silicon layer is smaller than the in-plane lattice parameter of the underlying SOI layer. In another embodiment, the dopant within the relaxed and doped silicon layer has an atomic size that is larger than the atomic size of silicon and, as such, the in-plane lattice parameter of the relaxed and doped silicon layer is larger than the in-plane lattice parameter of the underlying SOI layer. After forming the relaxed and doped silicon layer on the SOI substrate, the dopant within the relaxed and doped silicon layer is removed from that layer converting the relaxed and doped silicon layer into a strained (compressively or tensilely) silicon layer that is formed on an upper surface of an SOI substrate.

21 Claims, 1 Drawing Sheet

STRAINED SEMICONDUCTOR-ON-INSULATOR BY ADDITION AND REMOVAL OF ATOMS IN A SEMICONDUCTOR-ON-INSULATOR

BACKGROUND

The present disclosure provides a method of making a semiconductor material, and more particularly, the present disclosure provides a method of fabricating a strained semiconductor-on-insulator (SSOI) substrate without the need of wafer bonding.

In the semiconductor industry, there has been an increasing interest in enhancing performance of complementary metal oxide semiconductor (CMOS) devices by replacing conventional silicon-on-insulator (SOI) substrates with strained semiconductor-on-insulator (SSOI) substrates. The reason behind this interest is that SSOI substrates provide higher carrier (electrons/holes) mobility than a conventional SOI substrate. The strain in the SSOI substrates can either be compressive or tensile.

Conventional methods to fabricate SSOI substrates typically require a layer transfer process wherein a strained Si-containing layer located on a relaxed SiGe layer is transferred onto a handle wafer. In particular, the conventional process includes first creating a relaxed SiGe layer of a few microns in thickness on a surface of a Si-containing substrate. The relaxed SiGe layer typically has an in-plane lattice parameter that is larger than that of Si. Next, a Si-containing layer is grown on the relaxed SiGe layer. Because the SiGe layer has a larger in-plane lattice parameter as compared to Si, the Si-containing layer is under strain.

The structure, including the strained Si-containing layer located on a relaxed SiGe layer, is then bonded to a handle wafer, which typically includes an insulating layer, such as an oxide layer. The bonding occurs typically between the strained Si-containing layer and the insulator layer. The Si-containing substrate and the relaxed SiGe layer are then typically removed from the bonded structure to provide a strained Si-on-insulator substrate.

The conventional SSOI substrate preparation method described above is expensive and low-yielding because it combines two rather advanced substrate technologies, i.e., high-quality, thick SiGe/strain Si growth, and wafer bonding. Moreover, the conventional preparation method is unattractive for manufacturing a large volume of substrates. Also, the conventional methods of making SSOI substrates typically create a tensile strained Si-on-insulator.

In view of the above, a cost effective and manufacturable solution to fabricate SSOI substrates is still required for future high-performance semiconductor-containing CMOS products.

SUMMARY

This disclosure provides a cost-effective and manufacturable solution to produce strained semiconductor-on-insulator (SSOI) substrates that avoids wafer bonding which is typically required in conventional technologies to produce SSOI substrates.

In this disclosure a relaxed and doped silicon layer is formed on an upper surface of a silicon-on-insulator (SOI) substrate. In one embodiment, the dopant within the relaxed and doped silicon layer has an atomic size that is smaller than the atomic size of silicon and, as such, the in-plane lattice parameter of the relaxed and doped silicon layer is smaller than the in-plane lattice parameter of the underlying SOI layer. In another embodiment, the dopant within the relaxed and doped silicon layer has an atomic size that is larger than the atomic size of silicon and, as such, the in-plane lattice parameter of the relaxed and doped silicon layer is larger than the in-plane lattice parameter of the underlying SOI layer.

After forming the relaxed and doped silicon layer on the SOI substrate, the dopant within the relaxed and doped silicon layer is removed from that layer converting the relaxed and doped silicon layer into a strained silicon layer that is formed on an upper surface of an SOI substrate. In one embodiment in which the dopant within the relaxed and doped silicon layer has an atomic size that is smaller than the atomic size of silicon, a compressive strained silicon layer is formed on an upper surface of an SOI substrate. In another embodiment in which the dopant within the relaxed and doped silicon layer has an atomic size that is larger than the atomic size of silicon, a tensile strained silicon layer is formed on an upper surface of an SOI substrate.

In one aspect of the present disclosure, a method of forming a strained semiconductor-on-insulator substrate is provided that includes forming a relaxed and doped silicon layer on an upper surface of a silicon layer of a silicon-on-insulator substrate. The relaxed and doped silicon layer that is formed has an in-plane lattice parameter that is different from that of the silicon layer of the silicon-on-insulator substrate. In one embodiment, the relaxed and doped silicon layer has a smaller in-plane lattice parameter than that of the in-plane lattice parameter of the underlying silicon layer. In another embodiment, the relaxed and doped silicon layer has a larger in-plane lattice parameter than that of the in-plane lattice parameter of the underlying silicon layer. The dopant from the relaxed and doped silicon layer is then removed from the relaxed and doped silicon layer converting the relaxed and doped silicon layer into a strained (compressively or tensilely) silicon layer.

DETAILED DESCRIPTION

In the following description, numerous specific details are set forth, such as particular structures, components, materials, dimensions, processing steps and techniques, in order to provide an understanding of some aspects of the present disclosure. However, it will be appreciated by one of ordinary skill in the art that the various embodiments mentioned within this disclosure may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present disclosure provides an alternative method of forming a strained semiconductor-on-insulator (SSOI) substrate that avoids wafer bonding in forming the strained semiconductor layer. Broadly and as also mentioned above, the method includes forming a relaxed and doped silicon layer on an upper surface of a silicon layer of a silicon-on-insulator substrate. The relaxed and doped silicon layer that is formed has an in-plane lattice parameter that is different from that of the silicon layer of the silicon-on-insulator substrate. The dopant from the relaxed and doped silicon layer is then removed from the relaxed and doped silicon layer converting the relaxed and doped silicon layer into a strained silicon layer.

Embodiments of the present disclosure will now be described in greater detail by referring to the following discussion and drawings that accompany the present application. The drawings of the present application, which are referred to herein below in greater detail, are provided for illustrative purposes and, as such, they are not drawn to scale.

Figure 1:
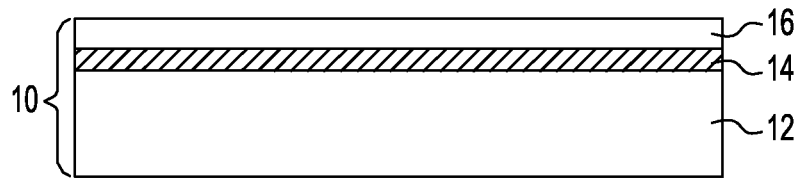
FIG. 1 is a pictorial representation (through a cross sectional view) illustrating a silicon-on-insulator (SOI) substrate that can be employed in one embodiment.

Referring first to FIG. 1, there is illustrated a silicon-on-insulator (SOI) substrate 10 that can be employed in one embodiment of the present application. The SOI substrate 10 includes a handle wafer 12, a buried insulator layer 14 located on an upper surface of the handle wafer 12 and a silicon layer 16 located on an upper surface of the buried insulator layer 14.

The silicon layer 16 can be undoped or doped with either an n-type or p-type dopant. The term 'p-type dopant' denotes an atom from Group IIIA of the Periodic Table of Elements including for example, B, Al, Ga and/or In. Of these Group IIIB Elements, and in one embodiment, B is employed. The term 'n-type dopant' denotes an atom from Group VA of the Periodic Table of Elements including for example, P, As and/or Sb. Of these Group VA Elements, and in one embodiment, P is employed. It is noted that the nomenclature IIIB and VA is from a CAS version of the Periodic Table of Elements.

The buried insulator layer 14 may be comprised of a crystalline or non-crystalline oxide or nitride. In one embodiment, the buried insulator layer 14 is an oxide. The buried insulator layer 14 may be continuous (as shown) or it may be discontinuous. When a discontinuous buried insulator layer is present, the buried insulator exists as a discrete island that is surrounded by semiconducting material, i.e., handle wafer 12 and silicon layer 16.

The handle wafer 12 of the SOI substrate 10 typically comprises a semiconducting material, including, but not limited to, Si, Ge, SiGe, SiC, SiGeC, Ga, GaAs, InAs, InP and all other III/V compound semiconductors. In one embodiment of the present disclosure, the handle wafer 12 is comprised of a Si-containing semiconducting material such as, for example, Si.

The semiconductor material of the handle wafer 12 and the silicon layer 16 may have a single crystal orientation (which may be the same or different from each other) or they may be comprised of different crystal orientations. In yet another embodiment, the silicon layer 16 has regions of different crystal orientations which allow for fabricating a FET upon a specific crystal orientation that enhances the performance of the FET. For example, a 'hybrid' SOI substrate can be formed which allows for providing a structure in which a pFET can be formed on a (110) crystal orientation, while an nFET can be formed on a (100) crystal orientation.

The SOI substrate 10 illustrated in FIG. 1 can be formed utilizing standard processing including, for example, a separation by ion implantation of oxygen (SIMOX) process or by a layer transfer process. In some embodiments, the SOI substrate 10 can be formed by depositing an insulator layer and then a silicon layer atop the handle wafer 10. Hybrid SOI substrates can be formed utilizing techniques that are also well known to those skilled in the art. See, for example, co-assigned U.S. Pat. No. 7,329,923, U.S. Publication No. 2005/0116290 and U.S. Pat. No. 7,023,055, the entire contents of each are incorporated herein by reference.

The thickness of the silicon layer 16 of the SOI substrate 10 may vary depending on the technique used in forming the same. Typically, the silicon layer 16 of the SOI substrate 10 has a thickness from 10 nm to 150 nm, with a thickness from 50 nm to 100 nm being even more typical. If the top silicon layer 16 of the SOI substrate 10 is not within the above range after processing, a thinning step such as etching can be used to provide a silicon layer 16 having the thickness mentioned above.

The thickness of the buried insulator layer 14 of the SOI substrate 10 may also vary depending on the technique used in forming the same. Typically, the buried insulator layer 14 of SOI substrate 10 has a thickness from 25 nm to 300 nm, with a thickness from 50 nm to 100 nm being even more typical. The thickness of the handle wafer 12 of the SOI substrate 10 is inconsequential to the present application.

After providing the SOI substrate 10 illustrated in FIG. 1, a relaxed and doped silicon layer 18 is formed directly on an upper surface of the silicon layer 16 of the SOI substrate 10. The resultant structure including the relaxed and doped silicon layer 18 located on the upper surface of the silicon layer 16 is shown, for example, in FIG. 2. In some embodiments, and as illustrated, the relaxed and doped silicon layer spans the entire upper surface of the silicon layer 16.

In another embodiment (not shown), at least one first relaxed and doped silicon layer is formed on at least one part of the upper surface of the silicon layer 16, and at least one second relaxed and doped silicon layer is formed on at least one other part of the upper surface of the silicon layer 16. The first and second relaxed and doped layers can be formed as described below utilizing block mask technology. Such an embodiment can allow for forming different dopant types in different device regions, i.e., nFET and pFET device regions, of the SOI substrate 10.

In one embodiment, the relaxed and doped silicon layer 18 that is formed may be partially relaxed. By "partially relaxed" it is meant that the relaxed and doped silicon layer 18 has a relaxation parameter of 20% or more. In another embodiment, the relaxed and doped silicon layer 18 is fully relaxed.

Notwithstanding the degree of relaxation of the relaxed and doped silicon layer 18, the relaxed and doped silicon layer 18 has an in-plane lattice parameter that differs from the in-plane lattice parameter of the underlying silicon layer 16. In one embodiment, the in-plane lattice parameter of the relaxed and doped silicon layer 18 is smaller than the in-plane lattice parameter of the underlying silicon layer 16. In another embodiment, the in-plane lattice parameter of the relaxed and doped silicon layer 18 is larger than the in-plane lattice parameter of the underlying silicon layer 16.

The relaxed and doped silicon layer 18 includes a dopant whose atomic size differs from the atomic size of silicon. In one embodiment, the relaxed and doped silicon layer 18 may include a dopant whose atomic size (i.e., atomic radius) is smaller than the atomic size of silicon; silicon's atomic size is typically 111 picometers. Illustrative examples of dopants whose atomic size is smaller than silicon include, but are not limited to, C, B, P and mixtures thereof. In one embodiment, the relaxed and doped silicon layer 18 is a relaxed C-doped silicon layer. In yet another embodiment, the relaxed and doped silicon layer 18 is a B-doped silicon layer. It is noted that a relaxed and doped silicon layer including a dopant having a smaller atomic size than silicon is used in embodiments in which a compressively strained silicon layer is desired.

In another embodiment, the relaxed and doped silicon layer 18 may include a dopant whose atomic size (i.e., atomic radius) is larger than the atomic size of silicon. Illustrative examples of dopants whose atomic size is larger than silicon include, but are not limited to, Ge, Ga, Sn and mixtures thereof. In one embodiment, the relaxed and doped silicon layer 18 is a relaxed Ge-doped silicon layer. It is noted that a relaxed and doped silicon layer including a dopant having a larger atomic size than silicon is used in embodiments in which a tensilely strained silicon layer is desired.

In one embodiment, the relaxed and doped silicon layer 18 has a continuous distribution of dopant therein. In another embodiment, the relaxed and doped silicon layer 18 has a gradient distribution of dopant therein. In some embodiments, the gradient distribution of dopant may increase from the interface of the underlying silicon layer 16 upwards to the top surface of the relaxed and doped silicon layer 18. In another embodiment, the gradient distribution of dopant may decrease from the interface of the underlying silicon layer 16 upwards to the top surface of the relaxed and doped silicon layer 18.

The relaxed and doped silicon layer 18 that is employed has a dopant concentration that is greater than the dopant concentration within the underlying silicon layer 16 of the SOI substrate 10. Typically, the relaxed and doped silicon layer 18 contains a dopant in a concentration of greater than $1E20$ atoms/cm$^3$, with a dopant concentration of greater than $1E21$ atoms/cm$^3$ being more typical.

In one embodiment, the relaxed and doped silicon layer 18 can be formed utilizing any in-situ doped epitaxial growth process that is well known to those skilled in the art. The epitaxial growth ensures that the relaxed and doped silicon layer 18 is crystalline and has a same crystallographic structure as that of the surface of the underlying silicon layer 16. The in-situ doped epitaxial growth process typically employs a silicon precursor in which the dopant atoms are present. The types of silicon precursors used in forming the relaxed and doped silicon layer 18 are well known to those skilled in the art. For example, a silane can be used in some embodiments as the silicon precursor.

In another embodiment, the relaxed and doped silicon layer 18 can be formed utilizing any epitaxial growth process that is well known to those skilled in the art followed by a step in which the dopant is introduced into a relaxed silicon layer. The step of introducing the dopant can include ion implantation, gas phase doping, or diffusion of a dopant from a dopant source material that is formed atop the relaxed silicon layer and after diffusion of dopant the dopant source material is removed.

The relaxed and doped silicon layer 18 is grown beyond the critical thickness such that after formation of the layer relaxation occurs. Typically, the relaxed and doped silicon layer 18 has a thickness of greater than 1000 angstroms, with a thickness of greater than 5000 angstroms being more typical. In some embodiments, the relaxed and doped silicon layer 18 is grown such that the defect density is on the order of about $10^7$ defects/cm$^2$ or less.

In some embodiments of the present disclosure, a thinning step such as etching can be employed to thin the relaxed and doped silicon layer 18 to a second thickness that is less than the as-deposited thickness value of the relaxed and doped silicon layer 18. The thinning step can be performed after providing the relaxed and doped silicon layer 18 or after removing the dopants from the relaxed and doped silicon layer.

Figure 3:
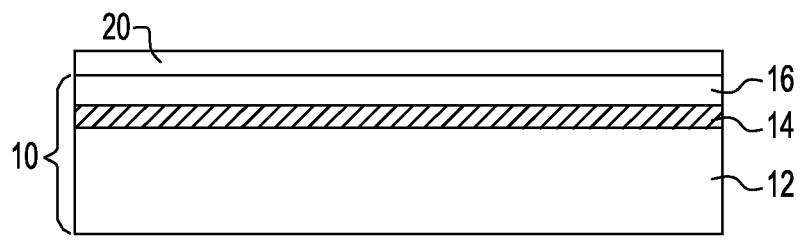
FIG. 3 is a pictorial representation (through a cross sectional view) illustrating the structure of FIG. 2 after removing the dopant from the relaxed and doped silicon layer providing a strained semiconductor-on-insulator (SSOI) substrate.

Referring now to FIG. 3, there is illustrated the structure that is formed after removing dopant from the relaxed and doped silicon layer 18 converting layer 18 into a strained silicon layer 20. Because the relaxed and doped silicon layer 18 has a different in-plane lattice parameter than the underlying silicon layer 16 of the SOI substrate 10, the resultant strained silicon layer 20 will also have a different in-plane lattice parameter than the underlying silicon layer 16 of the SOI substrate 10.

It is noted that the resultant strained silicon layer 20 that is formed includes a lower content of dopant as compared to that of the original relaxed and doped silicon layer 18. Typically, after dopant removal, the resultant strained silicon layer 20 has a dopant concentration of less than $1E18$ atoms/cm$^3$, with a dopant concentration of less than $1E17$ atoms/cm$^3$ being more typical.

In the embodiments in which a smaller atomic size dopant atom as compared with silicon is employed, the in-plane lattice parameters of the relaxed and doped silicon layer 18 and the correspondingly strained silicon layer 20 are smaller than that of the underlying silicon layer 16. In such an instance, the strained silicon layer 20 will be compressively strained.

In the embodiments in which a larger atomic size dopant atom as compared with silicon is employed, the in-plane lattice parameters of the relaxed and doped silicon layer 18 and the correspondingly strained silicon layer 20 are larger than that of the underlying silicon layer 16. In such an instance, the strained silicon layer 20 will be tensilely strained.

Figure 2:
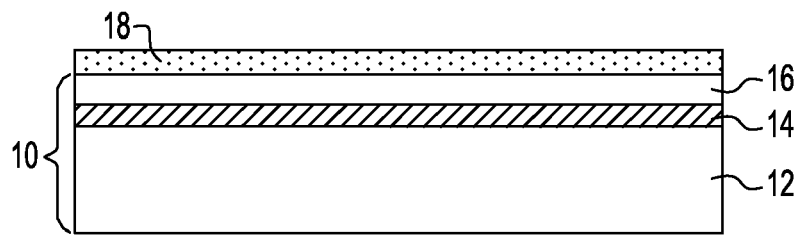
FIG. 2 is a pictorial representation (through a cross sectional view) illustrating the SOI substrate shown in FIG. 1 after forming a relaxed and doped silicon layer on an upper surface of the SOI substrate.

In one embodiment, the removal of the dopant from the relaxed and doped silicon layer 18 can be achieved by annealing, i.e., heating, the structure shown in FIG. 2 in an ambient including a reducing agent or an oxidizing agent.

The term "reducing agent" is used throughout this disclosure to denote an element or compound in a redox (reduction-oxidation) reaction that reduces the dopants within the relaxed and doped silicon layer 18. Examples of reducing agents that can be employed in the present disclosure include, but are not limited to, $H_2$, hydrocarbons, or metals. In one embodiment and when the dopant within the relaxed and doped silicon layer 18 is B, heating in $H_2$ can be employed to remove dopant from the relaxed and doped silicon layer 18.

The term "oxidizing agent" is used throughout this disclosure to denote an element or compound that either readily transfers oxygen atoms or that gains electrons in a redox chemical reaction. Examples of oxidizing agents that can be employed in the present disclosure include, but are not limited to, $O_2$ or ozone. In one embodiment and when the dopant within the relaxed and doped silicon layer 18 is C, heating in $O_2$ can be employed to remove dopant from the relaxed and doped silicon layer 18.

In some embodiments, the annealing is performed in an ambient of either a reducing agent or an oxidizing agent. In another embodiment, the annealing is performed in an ambient of either a reducing agent or an oxidizing agent that includes an inert gas such as, for example, He, Ne, Ar, Kr, Xe or mixtures thereof. When an inert gas is employed, the amount of oxidizing agent or reducing agent present in the admixture is typically from 0.5% to 20% based on 100% of the admixture.

The annealing step used to remove dopant from the relaxed and doped silicon layer 18 and cause the formation of the strained silicon layer 20 atop the silicon layer 16 is performed at a temperature from 600° C. to 1300° C., with a temperature from 900° C. to 1250° C. being more typical. The duration of the anneal may vary depending on the type of anneal process employed as well as the concentration of dopant with the relaxed and doped silicon layer 18. Typically, the duration of the anneal is from 1 minute to 60 minutes. The anneal may be a rapid thermal anneal, a furnace anneal, a laser anneal or a microwave. Typically, a rapid thermal anneal or a furnace anneal is employed.

In some embodiments (not shown), at least one other silicon layer and at least one other relaxed and doped silicon layer can be formed atop the structure shown in FIG. 3 and then the dopant within the at least one other relaxed and doped layer can be removed as described above providing a structure that includes multiple alternating layers of a silicon layer and a strained silicon layer.

Figure 4:
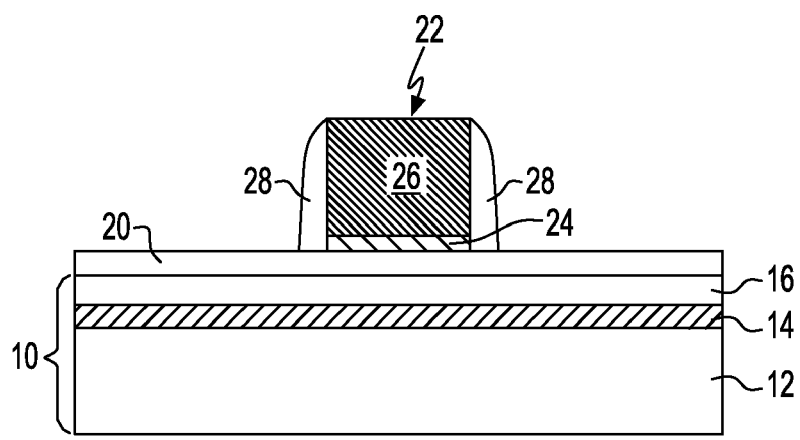
FIG. 4 is a pictorial representation (through a cross sectional view) illustrating the structure of FIG. 3 after forming at least one CMOS device on the SSOI substrate.

After performing the above processing steps, conventional CMOS processing can be carried out to form one or more CMOS devices such as field effect transistors (FETs) atop the strained silicon layer 20. A structure including at least one FET located on an upper surface of the strained silicon layer 20 is shown in FIG. 4. The CMOS processing is well known to those skilled in the art; therefore details concerning that processing are not needed herein. Each FET includes a patterned gate stack (herein after "FET gate stack 22") comprised of at least one gate dielectric 24 and at least one gate conductor 26. It is noted that the present disclosure is not limited to forming FETs. Instead, other semiconductor devices including, but not limited to, bipolar transistors, capacitors, diodes, memory cells, etc. can be formed alone, or in conjunction with each other.

The remaining description describes the elements of a typical FET and some basic techniques that can be used to fabricate each FET gate stack 22. In one embodiment, the at least one FET gate stack 22 is formed by deposition of various material layers, followed by patterning the deposited material layers via lithography and etching. In another embodiment, the at least one FET gate stack 22 is formed by a replacement gate process that includes the use of a dummy gate material.

Notwithstanding the technique used in forming the at least one FET gate stack 22, the at least one FET gate stack 22 includes, from bottom to top, at least one gate dielectric 24 and at least one gate electrode 26. In some embodiments (not shown), an optional gate electrode cap can be formed atop an uppermost surface of the at least one gate electrode 26.

The at least one gate dielectric 24 includes any gate insulating material such as for example, an oxide, a nitride, an oxynitride or a multilayered stack thereof. In one embodiment, the at least one gate dielectric 24 is a semiconductor oxide, a semiconductor nitride or a semiconductor oxynitride. In another embodiment, the at least one gate dielectric 24 includes a dielectric metal oxide having a dielectric constant that is greater than the dielectric constant of silicon oxide, e.g., 3.9. Typically, the at least one gate dielectric 24 that is employed has a dielectric constant greater than 4.0, with a dielectric constant of greater than 8.0 being more typical. Such dielectric materials are referred to herein as a high k dielectric. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the at least one gate dielectric 24. Each value of x is independently from 0.5 to 3 and each value of y is independently from 0 to 2.

The thickness of the at least one gate dielectric 24 may vary depending on the technique used to form the same. Typically, the at least one gate dielectric 24 has a thickness from 1 nm to 10 nm, with a thickness from 2 nm to 5 nm being more typical. When a high k gate dielectric is employed as the at least one gate dielectric 24, the high k gate dielectric can have an effective oxide thickness on the order of, or less than, 1 nm.

The at least one gate dielectric 24 can be formed by methods well known in the art. In one embodiment, the at least one gate dielectric 24 can be formed by a deposition process such as, for example, chemical vapor deposition (CVD), physical vapor deposition (PVD), molecular beam deposition (MBD), pulsed laser deposition (PLD), liquid source misted chemical deposition (LSMCD), and atomic layer deposition (ALD). Alternatively, the at least one gate dielectric 24 can be formed by a thermal process such as, for example, thermal oxidation and/or thermal nitridation.

The at least one gate electrode 26 comprises any conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the at least one gate electrode 26 is comprised of an nFET metal gate. In another embodiment, the at least one gate electrode 26 is comprised of a pFET metal gate. In a further embodiment, the at least one gate electrode 26 is comprised of polycrystalline silicon. The polysilicon gate can be used alone, or in conjunction with another conductive material such as, for example, a metal gate electrode material and/or a metal silicide gate electrode material.

The at least one gate electrode 26 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When Si-containing materials are used as the at least one gate electrode 26, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed.

The as-deposited at least one gate electrode 26 typically has a thickness from 10 nm to 100 nm, with a thickness from 20 nm to 50 nm being even more typical.

In some embodiments, an optional gate electrode cap (not shown) can be formed atop an uppermost surface of the at least one gate electrode 26. The optional gate electrode cap includes a dielectric oxide, nitride, oxynitride or any combination thereof including multilayered stacks. In one embodiment, the optional dielectric electrode cap is comprised of silicon nitride. When the optional gate electrode cap is present, the optional gate electrode cap is formed utilizing a conventional deposition process well known to those skilled in the art including, for example, CVD and PECVD. Alternatively, the optional gate electrode cap can be formed by a thermal process such as, for example, oxidation and/or nitridation. The thickness of the optional gate electrode cap may vary depending on the exact cap material employed as well as the process that is used in forming the same. Typically, the optional gate electrode cap has a thickness from 5 nm to 200 nm, with a thickness from 10 nm to 50 nm being more typical. The optional gate electrode cap is typically employed when an upper portion of the at least one gate electrode 26 is composed of a Si-containing material such as polysilicon.

Each FET can also include at least one spacer 28 whose base is located on an upper surface of the strained silicon layer 20. An edge of the at least one spacer 28 is located on a sidewall of the at least one FET gate stack 22. The at least one spacer 28 includes any dielectric material such as, for example, an oxide, a nitride, an oxynitride or any combination thereof. Typically, but not necessarily always, the at least one spacer 28 is comprised of a different material than the optional gate electrode cap. In one embodiment, the at least one spacer 28 is comprised of silicon oxide or silicon nitride. In another embodiment, the at least one spacer 28 includes a thin inner spacer, and a wider (relative to the inner spacer) outer spacer. In such an embodiment, the thin inner spacer can be comprised of silicon oxide, while the wider outer spacer can be comprised of silicon nitride.

The at least one spacer 28 can be formed utilizing processes that are well known to those skilled in the art. For example, the at least one spacer 28 can be formed by deposition of the spacer material, followed by etching. The width of the at least one spacer 28, as measured at its base, is typically from 2 nm to 50 nm, with a width, as measured at its base, from 5 nm to 15 nm being more typical.

Each FET also includes source/drain extension regions (not shown) and/or source/drain regions (also not shown) that are located within at least the strained silicon layer 20 at the footprint of each of the FET gate stacks 22. The source/drain extension regions can be formed into at least the strained silicon layer 20 utilizing an extension ion implantation process that is well known to those skilled in the art. The at least one FET gate stack 22 and, if present, the at least one spacer 28, serve as an implantation mask during the extension ion implant process. After implanting the extension regions, an anneal can be used to activate the extension regions. The anneal, which can be performed any time after the ion implantation step, is typically performed at a temperature greater than 800° C., with a temperature of greater than 850° C. being more typical.

The anneal can be performed utilizing any conventional anneal process. Examples of anneals that can be employed include, for example, a rapid thermal anneal, a furnace anneal, a laser anneal, a microwave anneal, or a combination of those techniques. The duration of the anneal, i.e., the annealing time, may vary depending on the exact anneal process utilized as well as the temperature of the anneal. Typically, the anneal is performed for a time period of 10 minutes or less. The anneal is typically performed in an inert ambient such as, for example, helium, nitrogen, and/or argon. In some embodiments, the annealing can be performed utilizing a forming gas (a mix of hydrogen and nitrogen).

It is observed that the portion of the strained silicon layer 20 that is located beneath the at least one FET gate stack 22 which is bounded by the extension regions is the device channel; note that the device channel is located within the strained silicon layer 20 and hence it has higher carrier mobility associated therewith.

In some embodiments, an optional halo implant is performed that forms optional halo regions (not shown) within at least the strained silicon layer 20. The optional halo implant can be performed utilizing any conventional halo implant, such as an angled halo ion implant, that is well known to those skilled in the art. After the optional halo implant, an optional halo activation anneal is typically performed at a temperature of 1350° C. or less. In one embodiment, the optional halo activation anneal can include a laser anneal or rapid thermal anneal.

Next, source/drain regions (not shown) are formed into at least the strained silicon layer 20. The source/drain regions are formed utilizing any conventional source/drain ion implantation process followed by any conventional annealing process including the anneal described above for activating the source/drain extensions regions. It is observed that the activation of the source/drain extension regions, halo regions and source/drain regions can be performed in individual annealing steps, or a single anneal can be used to activate each of the various implant regions.

In some embodiments, a metal semiconductor alloy contact can be formed atop the source/drain regions that are located in at least the strained silicon layer 20 utilizing any process that is capable of converting a portion of the strained silicon layer 20 into a metal semiconductor alloy, i.e., a metal silicide. In one embodiment, the metal semiconductor alloy contact is formed utilizing a silicide process. The silicide process can be self-aligned to the outer edge of the spacer 28. The silicide process includes forming a metal capable of forming a metal semiconductor alloy when reacted with a portion of the strained silicon layer 20. The metal used in forming the metal semiconductor alloy contact can include, but is not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying portion of the strained silicon layer 20 forming metal semiconductor alloy contacts on each side of the FET gate stack 22. Typically, the anneal is performed at a temperature of at least 250° C. or above. A single anneal step or multiple anneal steps can be used. Any non-reacted metal and the optional diffusion barrier are removed after the anneal has been performed.

In some embodiments, a metal semiconductor alloy contact can be formed directly atop the at least one gate electrode 26, when the optional gate electrode cap is not present and at least an upper portion of the at least one gate electrode 26 is composed of a Si-containing material.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a strained semiconductor-on-insulator substrate comprising:

forming a relaxed and doped silicon layer on an upper surface of a silicon layer of a silicon-on-insulator substrate, wherein said relaxed and doped silicon layer has an in-plane lattice parameter that is different from that of the silicon layer of the silicon-on-insulator substrate; and removing dopant from the relaxed and doped silicon layer to convert the relaxed and doped silicon layer into a strained silicon layer.

2. The method of claim 1 wherein said forming the relaxed and doped silicon layer includes an in-situ doped epitaxial growth process.

3. The method of claim 1 wherein said forming the relaxed and doped silicon layer includes epitaxial growth of a relaxed silicon layer, followed by introducing a dopant within the relaxed silicon layer.

4. The method of claim 1 wherein said in-plane lattice parameter of the relaxed and doped silicon layer is smaller than the in-plane lattice parameter of the underlying silicon layer, and wherein said relaxed and doped silicon layer includes a dopant that has a smaller atomic size as compared to silicon.

5. The method of claim 4 wherein said dopant is B or C.

6. The method of claim 1 wherein said in-plane lattice parameter of the relaxed and doped silicon layer is larger than the in-plane lattice parameter of the underlying silicon layer, and wherein said relaxed and doped silicon layer includes a dopant that has a larger atomic size as compared to silicon.

7. The method of claim 6 wherein said dopant is Ge.

8. The method of claim 1 wherein said relaxed and doped silicon layer has a dopant concentration of greater than 1E20 atoms/cm$^3$.

9. The method of claim 1 wherein said removing dopant from the relaxed and doped silicon layer includes annealing in an ambient that includes a reducing agent.

10. The method of claim 9 wherein said reducing agent is $H_2$.

11. The method of claim 9 wherein said annealing is performed at a temperature from 600° C. to 1300° C.

12. The method of claim 11 wherein said annealing is a rapid thermal anneal, a furnace anneal, a laser anneal or a microwave anneal.

13. The method of claim 1 wherein said removing dopant from the relaxed and doped silicon layer includes annealing in an ambient that includes an oxidizing agent.

14. The method of claim 13 wherein said oxidizing agent is $O_2$ or ozone.

15. The method of claim 13 wherein said annealing is performed at a temperature from 600° C. to 1300° C.

16. The method of claim 15 wherein said annealing is a rapid thermal anneal, a furnace anneal, a laser anneal or a microwave anneal.

17. The method of claim 1 further comprising forming at least one CMOS device on an upper surface of the strained silicon layer.

18. The method of claim 17 wherein said at least one CMOS device includes at least one field effect transistor.

19. The method of claim 1 further comprising forming at least one other silicon layer and at least one other relaxed and doped silicon layer atop the strained silicon layer, and removing dopant from the at least one other relaxed and doped silicon layer to provide a structure including alternating layers of silicon and strained silicon.

20. A method of forming a strained semiconductor-on-insulator substrate comprising:
    forming a relaxed and doped silicon layer comprising B or C on an upper surface of a silicon layer of a silicon-on-insulator substrate, wherein said relaxed and doped silicon layer has an in-plane lattice parameter that is smaller than that of the silicon layer of the silicon-on-insulator substrate; and
    removing the B or C from the relaxed and doped silicon layer to convert the relaxed and doped silicon layer into a compressively strained silicon layer.

21. A method of forming a strained semiconductor-on-insulator substrate comprising:
    forming a relaxed and doped silicon layer comprising Ge on an upper surface of a silicon layer of a silicon-on-insulator substrate, wherein said relaxed and doped silicon layer has an in-plane lattice parameter that is larger than that of the silicon layer of the silicon-on-insulator substrate; and
    removing Ge from the relaxed and doped silicon layer to convert the relaxed and doped silicon layer into a tensilely strained silicon layer.

* * * * *